(12) United States Patent
Cecil et al.

(10) Patent No.: US 11,860,531 B2
(45) Date of Patent: Jan. 2, 2024

(54) SKELETON REPRESENTATION OF LAYOUTS FOR THE DEVELOPMENT OF LITHOGRAPHIC MASKS

(71) Applicant: Synopsys, Inc., Mountain View, CA (US)

(72) Inventors: Thomas C. Cecil, Menlo Park, CA (US); David W. Thomas, Sunnyvale, CA (US)

(73) Assignee: Synopsys, Inc., Sunnyvale, CA (US)

( * ) Notice: Subject to any disclaimer, the term of this patent is extended or adjusted under 35 U.S.C. 154(b) by 289 days.

(21) Appl. No.: 17/180,653

(22) Filed: Feb. 19, 2021

(65) Prior Publication Data
US 2021/0255539 A1 Aug. 19, 2021

Related U.S. Application Data

(63) Continuation of application No. PCT/US2021/018034, filed on Feb. 12, 2021.

(60) Provisional application No. 62/977,020, filed on Feb. 14, 2020.

(51) Int. Cl.
*G03F 1/36* (2012.01)

(52) U.S. Cl.
CPC ...................... *G03F 1/36* (2013.01)

(58) Field of Classification Search
CPC ........................................................ G03F 1/36
USPC ............................................................. 430/5
See application file for complete search history.

(56) References Cited

U.S. PATENT DOCUMENTS

| 6,081,658 | A | 6/2000 | Rieger et al. |
| 7,831,954 | B2 | 11/2010 | Rieger et al. |
| 9,561,622 | B2 | 2/2017 | Das et al. |
| 10,262,100 | B2 | 4/2019 | Cecil |
| 2004/0068712 | A1 | 4/2004 | Heng et al. |
| 2004/0128642 | A1 | 7/2004 | Beaudette |
| 2005/0127428 | A1 | 6/2005 | Mokhlesi et al. |
| 2006/0190224 | A1 | 8/2006 | Allen et al. |
| 2019/0346768 | A1 | 11/2019 | Huang et al. |

FOREIGN PATENT DOCUMENTS

TW          I637441 B     10/2018

OTHER PUBLICATIONS

PCT International Search Report and Written Opinion, PCT Application No. PCT/US2021/018034, dated May 11, 2021, 14 pages.
Taiwan Intellectual Property Office, Office Action, Taiwanese Patent Application No. 110105408, dated Feb. 16, 2022, 11 pages.
Ogniewicz, R. et al., "Voronoi Skeletons: Theory and Applications," Proceedings 1992 IEEE Computer Society Conference on Computer Vision and Pattern Recognition, 1992, pp. 63-69, vol. 1.
Taiwan Intellectual Property Office, Office Action w/English Translation, Taiwanese Patent Application No. 110105408, dated Sep. 6, 2023, 13 pages.

*Primary Examiner* — Christopher G Young
(74) *Attorney, Agent, or Firm* — Fenwick & West LLP

(57) ABSTRACT

In certain embodiments, a method includes the following steps. A layout used in a lithographic mask development process is accessed. For example, the layout may be the layout of the mask itself, or it may be the layout of the resulting printed pattern on the wafer. The layout includes a number of disjoint shapes. Skeleton representations for at least some of the disjoint shapes in the layout are determined. The skeleton representation of an individual shape has elements of two or more nodes connected by edges. It also includes size parameters for at least some of the elements. The skeleton representations of the shapes are used in the mask development process.

20 Claims, 12 Drawing Sheets

SKELETON REPRESENTATION OF LAYOUTS FOR THE DEVELOPMENT OF LITHOGRAPHIC MASKS

RELATED APPLICATION

This application is a continuation of International Application No. PCT/US21/18034, "Skeleton Representation of Layouts for the Development of Lithographic Masks," filed Feb. 12, 2021; which claims the benefit of U.S. Provisional Application No. 62/977,020, "Skeleton Mask Representation," filed Feb. 14, 2020; both of which are incorporated by reference in their entirety.

TECHNICAL FIELD

The present disclosure relates to the development of lithographic masks, for example as used in the fabrication of integrated circuits.

BACKGROUND

As designs for integrated circuits are becoming larger, denser, and more complex, the demands on computational lithography solutions for developing the masks used in fabrication are increasing. The features on masks are becoming smaller and less rectilinear. For example, advanced mask writing tools can produce curvilinear shapes. This makes their simulation more difficult and more computationally intensive. In addition, the number of features on a mask is increasing, thus further increasing the compute requirements. The lithography process itself is also becoming more complex. For example, illumination sources are becoming more complicated. This, in turn, requires more sophisticated analysis. Thus, when processing a mask layout by mask related applications such as optical proximity correction (OPC), inverse lithography technology (ILT), and lithography verification, it is desirable to take steps to reduce the processing demands.

SUMMARY

In certain embodiments, a method includes the following steps. A layout used in a lithographic mask development process is accessed. For example, the layout may be the layout of the mask itself, or it may be the layout of the resulting printed pattern on the wafer. The layout includes a number of disjoint shapes. Skeleton representations for at least some of the disjoint shapes in the layout are determined. The skeleton representation of an individual shape has elements of two or more nodes connected by edges. It also includes size parameters for at least some of the elements. The skeleton representations of the shapes are used in the mask development process.

Other aspects include components, devices, systems, improvements, methods, processes, applications, computer readable mediums, and other technologies related to any of the above.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Figure 1:
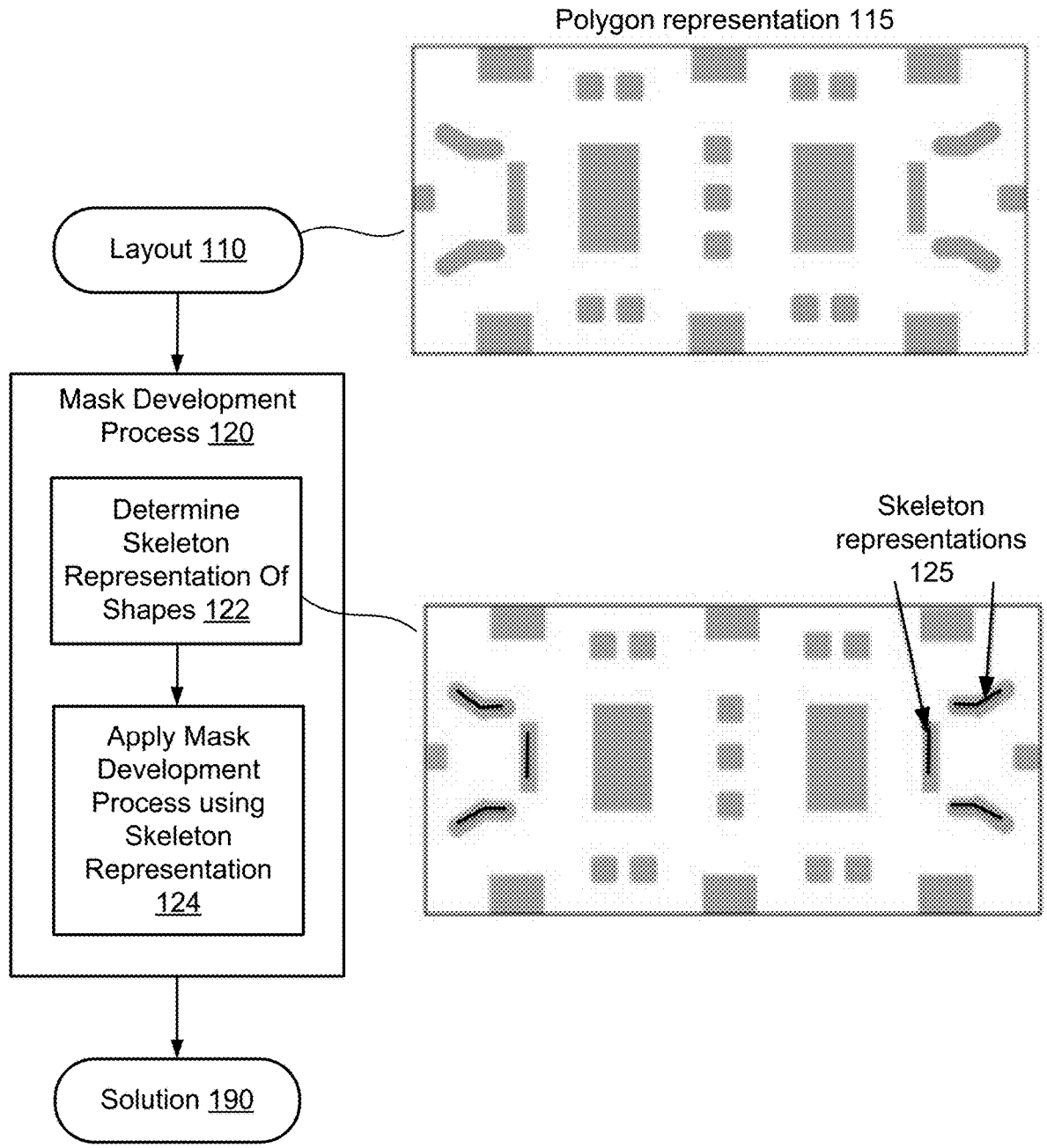
FIG. 1 depicts a flowchart for a mask development process in accordance with some embodiments of the present disclosure.

Aspects of the present disclosure relate to skeleton representations of layouts for the development of lithographic masks. Traditionally, mask layouts are represented by polygons and, more specifically, rectilinear polygons. However, as lithography becomes more complex and challenging, mask layouts are also becoming more complex. The use of sub-resolution assist features and non-rectangular and even curved shapes makes the traditional representation based on rectilinear polygons less than ideal. Representing a curved shape by rectilinear polygons requires a large number of polygons and still represents the curved edge by a staircase approximation. Even if non-rectilinear polygons are allowed, a curved edge will still require a polygon with a large number of sides to approximate the curve.

Many processes used in the development of masks, such as optical proximity correction (OPC), inverse lithography technology (ILT), and lithography verification, require the analysis or manipulation of these representations. For example, these mask development processes may introduce slight changes in the layouts in order to determine whether the changes may be beneficial.

In the approach described below, layouts are represented by a skeleton representation, rather than by polygons. The layouts could be the layout of the mask itself, the layout of the resulting printed pattern on the wafer, a two-dimensional representation of the aerial image produced by the mask, or other types of two-dimensional images used for mask development. The layout includes a large number of shapes, which traditionally may be represented by rectilinear polygons. Here, at least some of the shapes are represented by a skeleton representation instead of or in addition to other types of representations. The skeleton representation of an individual shape includes the "skeleton", which corresponds to the axis or centerline of the shape. The elements of the skeleton include two or more nodes connected by edges. The nodes are the "joints" of the skeleton, and the edges are the "bones" of the skeleton. The skeleton representation also includes size parameters for at least some of these elements. These size parameters provide information about the size of the shape at different locations along the skeleton. For example, size parameters for edge elements in the skeleton representation may be based on widths of the shape along those edges. Size parameters for nodes in a skeleton representation may be based on local radii of the shape at those nodes.

The skeleton representation can be a more compact and more computationally efficient representation of the layout for certain mask development processes. For example, if it is desired to move the position of a shape or change the thickness of a shape, this may be achieved simply by modifying the corresponding elements (nodes and edges) and/or by changing various size parameters for those elements. As a result, the computation speed is increased and the computation resources required (memory and processor utilization) is reduced.

FIG. 1 depicts a flowchart for a mask development process in accordance with some embodiments of the present disclosure. The techniques described in this disclosure may be applied to many types of mask development processes 120. This includes both mask synthesis processes (e.g., design a mask to achieve a desired result) and mask verification processes (e.g., confirm whether a mask design produces the result desired). It also includes both forward propagation processes (e.g., predict the aerial image produced by a mask) and backwards propagation (e.g., from a desired aerial image, propagate backwards to determine a mask that will produce that aerial image). Examples of mask development processes 120 include optical proximity correction (OPC), inverse lithography technology (ILT), and lithography verification (including mask design rule checks).

The input to the mask development process 120 is a layout 110 of various geometrical shapes. For the mask development process 120, the layout 110 may be a layout of a mask used to fabricate an integrated circuit, although the skeleton representation is not limited to this example. In many cases, the shapes in the layout are represented as polygons, as shown in the polygon representation 115 of FIG. 1.

The result of the mask development process 120 will generically be referred to as the "solution" 190. The solution will depend on the mask development process 120. Table 1 below lists some example applications. The "Layout" column is the input to the mask development process, and the "Solution" column is the output. The column "Skeleton Representation" indicates what quantities may be represented by skeleton representations.

TABLE 1

Some example mask development processes

| Layout | Mask Development Process | Solution | Skeleton Representation |
| --- | --- | --- | --- |
| Desired printed pattern on wafer | Optical proximity correction (OPC) | Mask layout | Mask, or Printed pattern or Inverse |
| Desired printed pattern on wafer | Inverse lithography technology (ILT) | Mask layout | Mask, or Printed pattern or Inverse |
| Mask layout, Desired printed pattern on wafer | Lithography verification | Aerial image, Simulated printed pattern on wafer, Printing quality metrics, Mask quality metrics | Mask, or Printed pattern or Inverse |
| Desired printed pattern on wafer | Sub-resolution assist features (SRAF) | Added assist features | Assist features or Space between assist features, or Printed pattern or Inverse |
| Desired printed pattern on wafer | Design modification (retargeting) | Modified design layout | Design to be modified, or Spacing between design polygons being modified |

In one approach, the mask development process 120 is applied to the shapes in the layout by using a skeleton representation 125 for at least some of the shapes, as shown in the righthand side of FIG. 1. The layout 110 includes a large number of disjoint shapes. A skeleton representation is determined 122 for at least some of the shapes. The skeleton representation of an individual shape includes elements of two or more nodes connected by edges. The skeleton representation also includes size parameters for at least some of the elements. The mask development process is then applied 124 using the skeleton representation of the shapes.

Figure 2A:
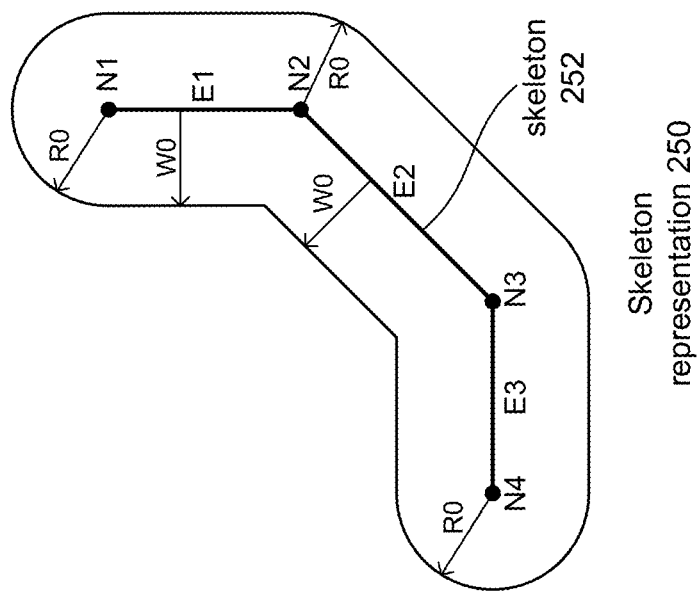
FIGS. 2A-2C depict examples of polygon representations and the corresponding skeleton representations of individual shapes in the layout.
Figure 2A:
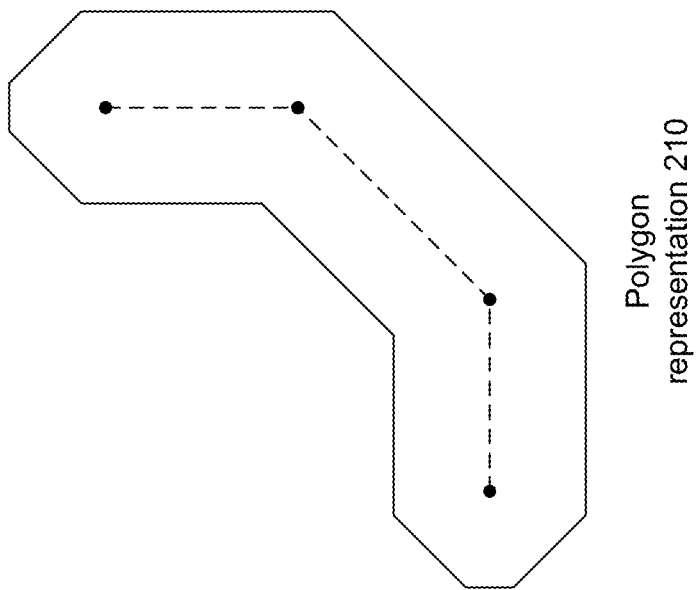
Figure 2B:
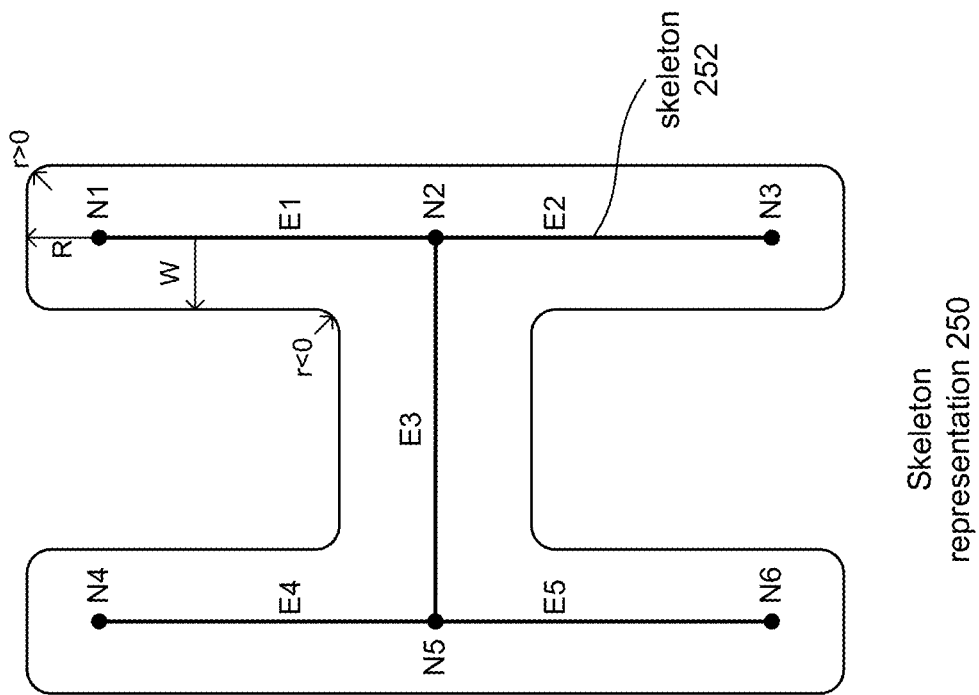
Figure 2B:
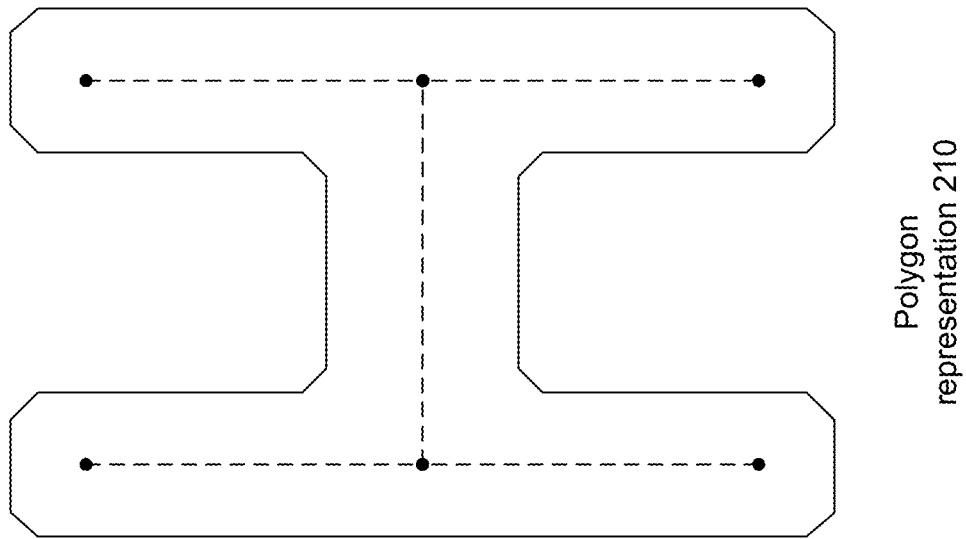
Figure 2C:
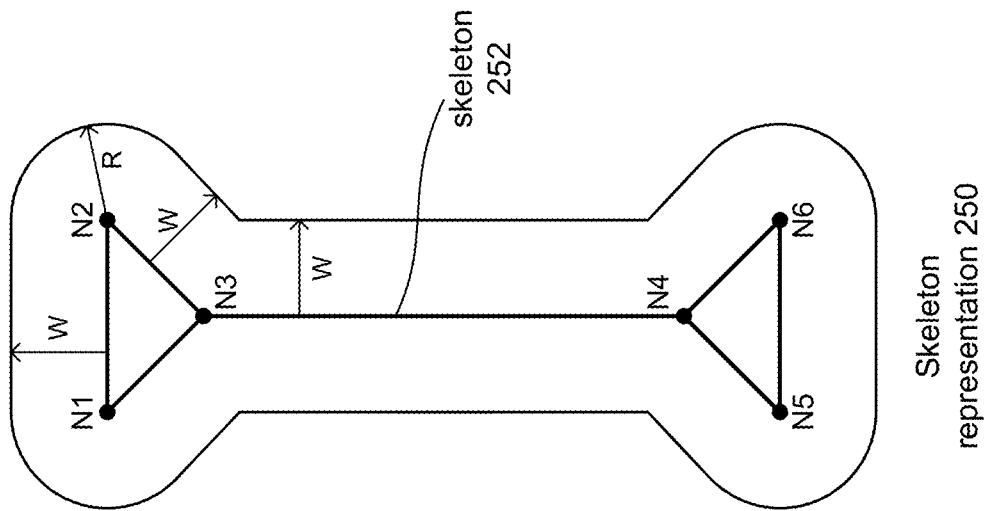
Figure 2C:
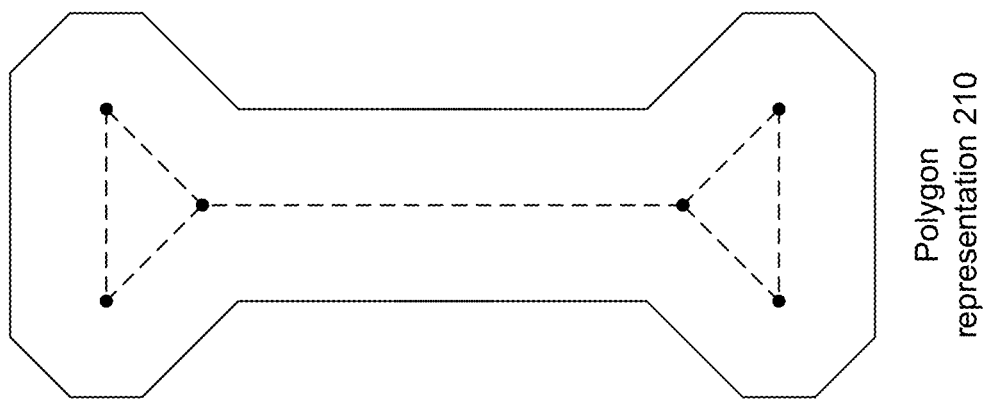

FIGS. 2A-2C depict examples of polygon representations and the corresponding skeleton representations of individual shapes in the layout. In each figure, the left side shows the polygon representation with just the skeleton superimposed in dashed lines, and the right side shows the skeleton representation with both the skeleton and the edges defined by the size parameters. The polygon representation 210 is a piecewise linear approximation of the border of the shape. In these examples, the polygon representation 210 is based on border segments at 45 degree angles. The skeleton representation 250 includes a piecewise connected skeleton 252 of nodes and edges. In the figures, the nodes are circles and the edges are thicker lines connecting the circles. The skeleton 252 is a representation of the two dimensional mask polygon 210 but in a "lower" dimension. It may be based on a morphological erosion of the shape 210.

The skeleton representation 250 may have additional attributes. In FIG. 2A, the nodes and edges are associated with size parameters. Nodes N are characterized by a local radius R, and edges E are characterized by a width W. These size parameters represent the local radius R of the curve defined by a node, and the width W of the shape defined by an edge. Node N1 is a terminal node (i.e., connected to only one other node), so the shape has a tip with radius R=R0. Edges E1, E2, E3 all have width W=W0=R0. Node N4 is also a terminal node with radius R=R0. Nodes N2 and N3 are interior nodes (connected to two or more other nodes). Their radii R=R0 define the shape of the local curved shape centered on those nodes. These attributes can be used to reconstruct the original shape 210 from the base skeleton 252 through a dilation or sizing procedure. The sizing procedure uses the size parameters defined at the nodes/edges to size the corresponding segment of the base shape 210 appropriately. Reducing the mask representation to a lower dimension allows simpler algorithms to be implemented for various geometry manipulations, and there are many features on the mask, such as assist features, which have high aspect ratios and are well represented by a non-branching skeleton, such as shown in FIG. 2A.

The skeleton representation may include additional attributes to represent more complicated shapes, including those with branching skeletons. In FIG. 2B, the axis of the shape has multiple branches in an "H" shape, so the skeleton 252 is branching. It includes nodes N1-N6 and edges E1-E5. In addition, the tips of the shape are rounded corners rather than circular arcs. To capture this, the terminal node N1 is characterized by two size parameters: R and r. R defines the width of the terminal shape, and r defines the local radius of the corners. So r=0 specifies a squared tip, and r=R specifies a circular tip as shown in FIG. 2A. In FIG. 2B, 0<r<R and the tip has rounded corners. In addition, nodes N2 and N5 may have negative values of r, to specify the shape of the interior corners along the crossbar of the "H". Other parameters may also be used to provide more degrees of freedom. For example, tips and other curves corresponding to nodes may be elliptical, polygonal or other shapes. The branches corresponding to edges may vary in width: linearly increasing or decreasing, varying periodically, or otherwise. Different parameters may be used to capture these and other variations.

FIG. 2C shows another example where the skeleton 252 has six nodes N1-N6, but nodes N1-N3 are connected as a polygon, as are nodes N4-N6. In some cases, shapes may have interior holes.

Nodes and edges may also have attributes that capture information other than the original shape. One example is association from a node or edge to a particular polygon feature. For example, a particular skeleton node N or edge E can be associated with a particular polygon segment(s). This may be used in OPC solvers where the node N and its parameters, such as radius, are adjusted until the simulated mask (which is defined by N and other skeleton nodes) prints an image which is on target at the polygon segment or a point on the segment. Other examples include constraints on displacement of the node/edge, constraints on the size of the node/edge, and other constraints on the segment or the shape associated with the node/edge.

Figure 3B:
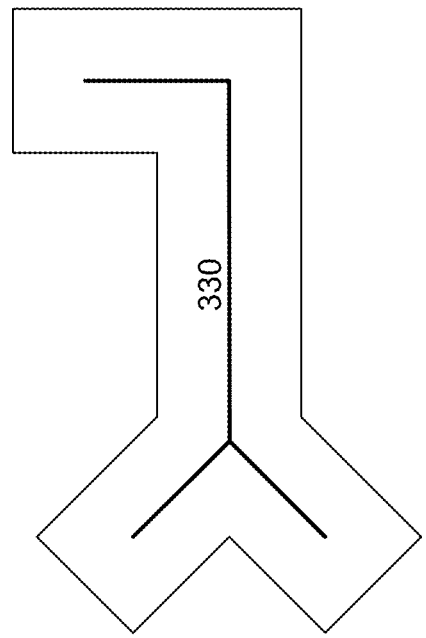
FIGS. 3A-3B depict converting a polygon representation to a skeleton representation.
Figure 3A:
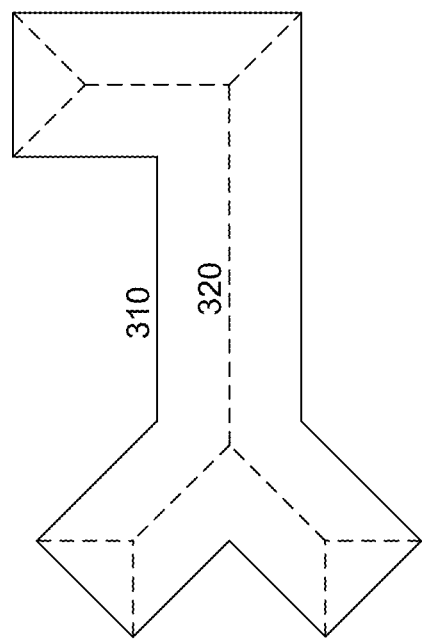

Different techniques may be used to generate the skeleton representation from a polygon or other representation. One example is shown in FIGS. 3A-3B. In this example, the polygon representation 310 of a shape is first converted to a Voronoi diagram 320, as shown in FIG. 3A. The Voronoi diagram is the medial axis of the polygon. As shown in FIG. 3B, the Voronoi diagram is them trimmed to create the skeleton 330 of nodes and edges. Trimming may be based on functions of the distance between points on the polygon border which define a particular point on the Voronoi diagram. Alternatively, the trimming may be based on proximity of the medial axis to the border. The additional attributes, such as widths and radii and which polygon segments correspond to which skeleton elements, can then be attached to the skeleton.

Figure 3D:
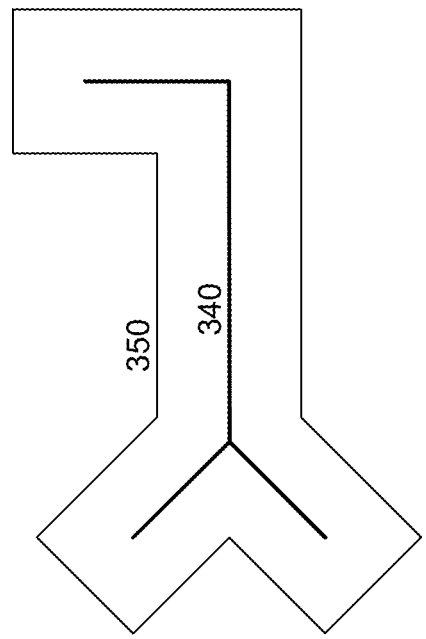
FIGS. 3C-3D depict converting a skeleton representation to a polygon representation.
Figure 3C:
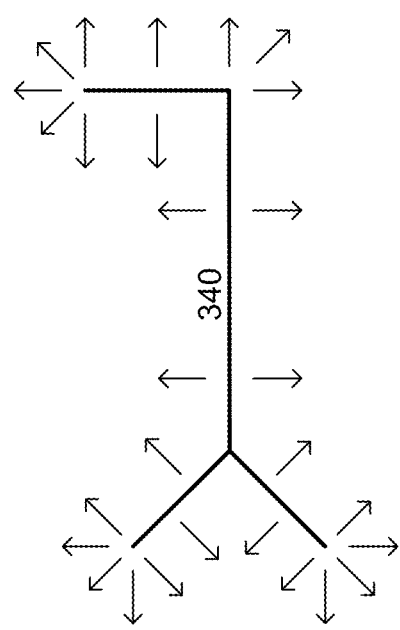

In the reverse direction, the skeleton representation may be converted to the full shape, such as a polygon representation, using different techniques. One approach is shown in FIGS. 3C-3D. FIG. 3C shows the skeleton 340. The nodes and edges of the skeleton are expanded according to their radii and widths, as indicated by the light arrows. Alternatively, polygons may be created for nodes and edges and then merging the polygons, with the resulting polygon 350 shown in FIG. 3D. In some cases, the skeleton may be simplified prior to creating polygons.

There are many use cases where the skeleton representation is more efficient than other representations. In one class of use cases, it is desirable to shift a shape or part of a shape in a direction that is perpendicular to the axis of the shape. The skeleton representation naturally allows for this. An example of this use case is the use of perturbation tables for OPC. Perturbation tables allow a tool to quickly compute changes in the solution produced by a lithography simulation from a mask M, when perturbations to the border of M are applied (i.e., when the borders of shapes are moved). For example, a perturbation table may tabulate the change in the wafer intensity for a given mask perturbation. The use of perturbation tables with skeletons is described below.

The general mask synthesis problem can be framed as an optimization of a cost function C(L) which takes as input the lithographic signal L (e.g., a mask layout) and returns a cost value C. The gradient of C with respect to different perturbations P may be computed. These gradients dC/dP may be used to optimize the layout through a gradient based optimization scheme.

Figure 4A:
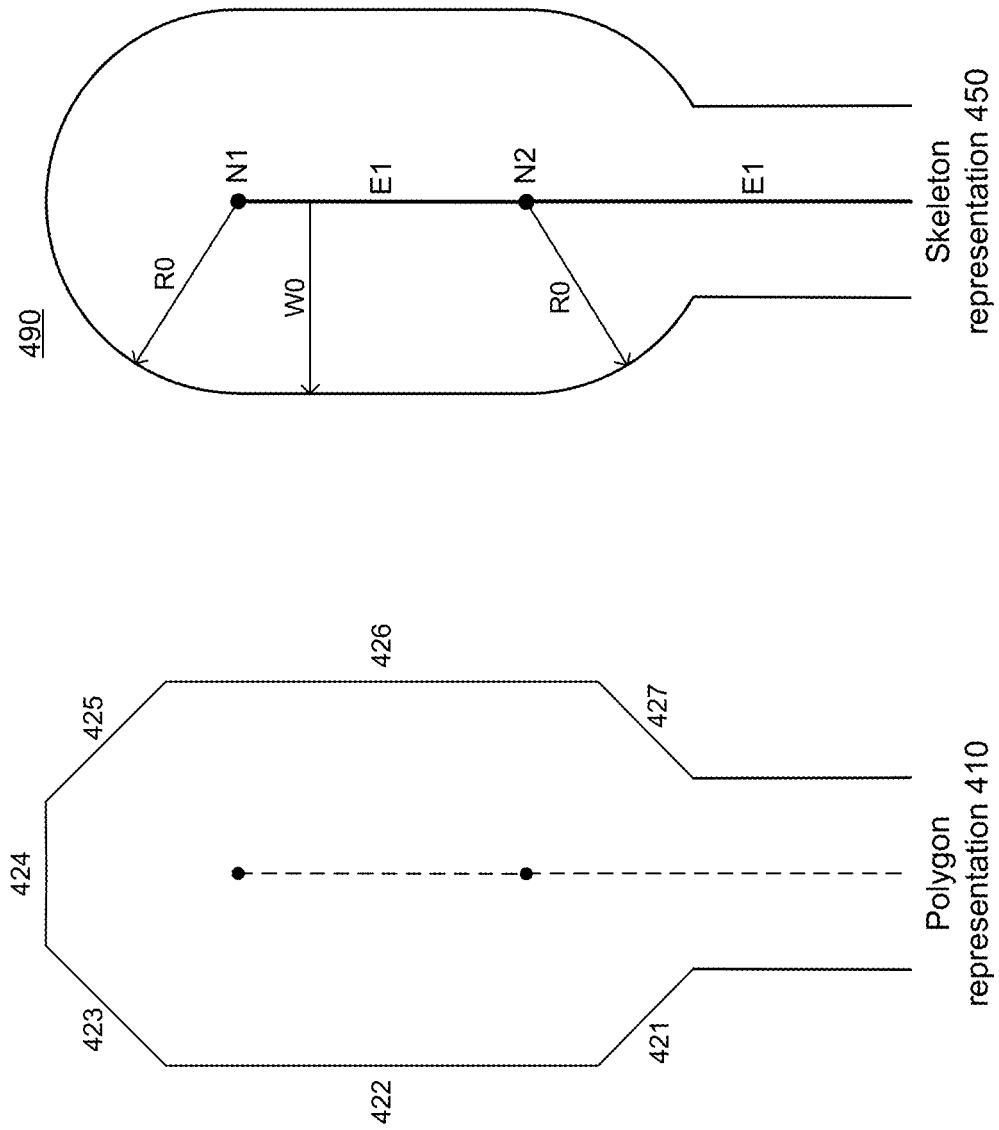
FIG. 4A depicts perturbation of a tip of a shape.

FIG. 4A depicts perturbation of an end 490 of a shape. In the skeleton representation 450, the end is represented by nodes N1, N2 and edge E1. Nodes N1, N2 have radius R=R0 and edge E1 has width W=W0=R0. If the polygon representation 410 is used, then the tip is represented by seven border segments 421-427 that approximate the rounded tip. This is not even that good an approximation. More accurate approximations would use even more border segments.

Perturbing the tip would require moving all of the affected border segments together. As each individual border segment is perturbed, the resulting change in the cost function is measured and a lithography cost gradient dC/dP may be computed for a given perturbation P. However, if the skeleton representation for the shape is used, the gradient dC/dP may be computed with respect to the geometric parameters for the skeleton, which may be simpler and more computationally efficient.

For example, assume that the perturbation of interest is increasing the size of the end 490. For the skeleton representation, this is equivalent to increasing the size parameter W=R, with some corresponding movement of the location of node N2. The effect of the perturbation is given by the gradient dC/dW. In the polygon representation, the seven border segments 421-428 are moved together and the total gradient is the sum of the individual gradients with respect to each border segment.

Figure 4B:
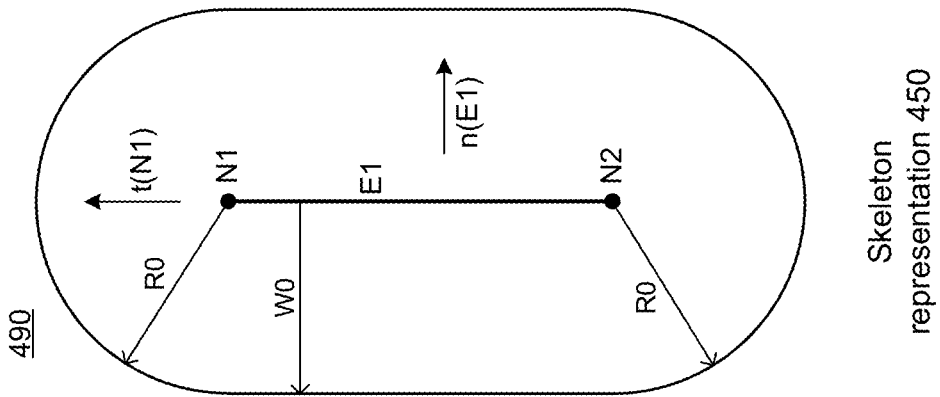
FIG. 4B depicts another example of perturbation of a shape.
Figure 4B:
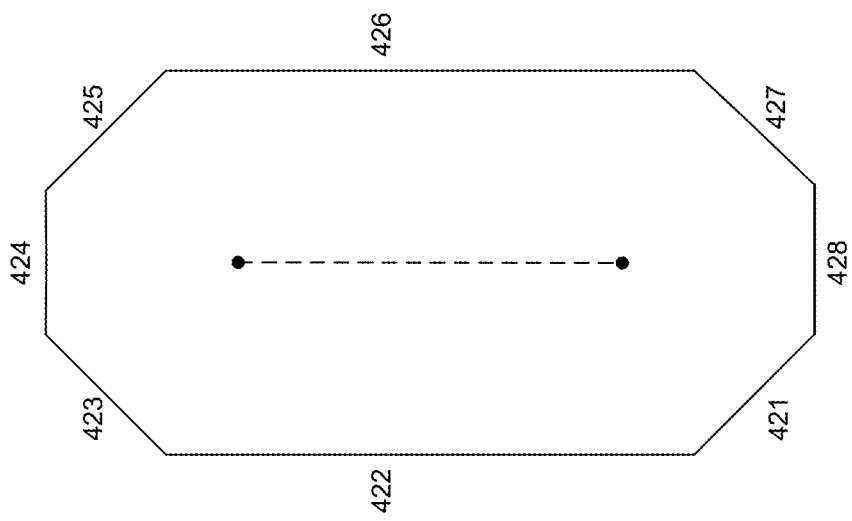

Now consider another example as shown in FIG. 4B. In this example, node N1 is the skeleton element to be optimized. In particular, consider the optimization of node N1's position along a particular direction v. First assume v=t(N1), the tangent to the skeleton edge E1 which connects to node N1. This considers stretching and shrinking the shape along its axis. If the formulation is available, the gradient $dC/dN_T$ may be calculated and used for optimization.

Alternatively, the gradient may be constructed from the collective derivative of the polygon border segments associated with node N. Call this set $D=\{D_i\}$. From the construction of the polygon from the skeleton, the set D include border segments 423-425. Each of those segments $D_i$ will have its own magnitude of cost change $dC_i$ and the normals $\{n_i\}$ and lengths $\{L_i\}$ of those segments may be used to project the cost change onto t(N) according to Eqn. (1).

$$\text{Tangential Stretch derivative} = \frac{dC}{dN_T} = \sum dC_i * (n_i \cdot t(N1)) * L_i \quad (1)$$

where the summation is over the polygon segments i (segments 423-425) and · is the dot product.

Now consider a change in the radius R of the node N1. To compute the derivative with respect to the change in the radius at node N1 (dC/dR), the system can use the sum of $dC_i$ projected onto the outward normal of the corresponding polygon edges 423-425.

Now consider a lateral shift of the shape, which is a movement of the edge E1 in a direction perpendicular to its direction. To compute the derivative with respect to lateral shift of the shape, the system can find the derivative with respect to moving edge E1 in a direction orthogonal to the edge (dC/dE).

If the polygon representation is used to compute this, the segments D are projected onto the normal vector n(E1) of edge E1. This is given by Eqn. (2).

$$\text{Shift derivative} = \frac{dC}{dE} = \sum dC_i * (n_i \cdot n(E1)) * L_i \quad (2)$$

where the summation is over the affected polygon segments i. Note that the border segments D associated with E1 in Eqn. (2) are a different set than those associated with node N1 in Eqn. (1). Other variations of combinations of these derivatives can be computed so as to allow for other skeleton modifications that may be useful depending on the application needs.

Once these gradients are computed, a gradient based optimization scheme may be used to move the skeleton elements or modify their parameters thus optimizing the mask to achieve an improved cost function C.

The approach described above for OPC may also be used for ILT and other mask development processes. In ILT, the optimization of the skeleton elements uses an ILT cost function and corresponding gradient field, which may be computed as described above except that the derivative values $dC_i$ are computed from an ILT cost function gradient field which can be sampled at the polygon edges. The subsequent movement by tangential node shifting, modifying the radius, or edge shifting will be similar to that described above. This is because the ILT gradient is computed with respect to a level set function whose outward normal has magnitude=1 at the polygon edges.

Figure 5:
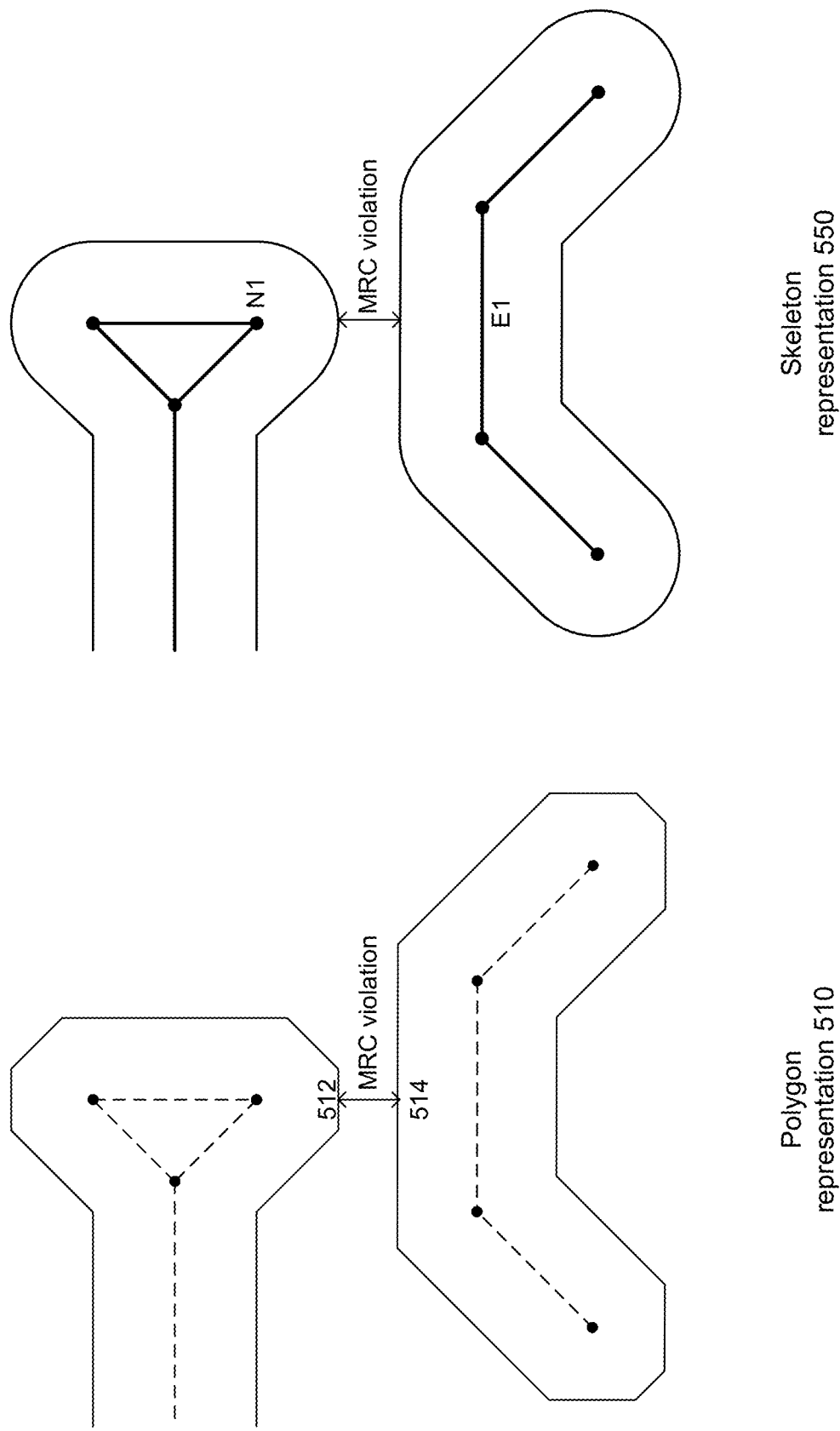
FIGS. 5 and 6 depict the use of skeleton representations for mask rule checking.

Similar to lithography cost based optimization steps, MRC (mask rule checking) enforcement can also be done by computing the appropriate corrections on the mask polygon edges, and then applying them in a way as described above to modify the skeleton element locations and/or parameters. Thus standard MRC checks can be applied that would be used for polygons, and then the violation information can be used to guide the skeleton geometric operations to resolve MRC violations. In FIG. 5, border segments 512 and 514 of the polygon representation 510 are the two segments that are closest to each other. They are too close and create a mask rule violation. A polygon-based MRC check identifies these two border segments and the rule violation. Segment 512 is associated with node N1 of the top skeleton, and segment 514 is associated with edge E1 of the bottom skeleton. These skeleton elements 550 may then be modified in a manner that reduces or eliminates the MRC violation.

Figure 6:
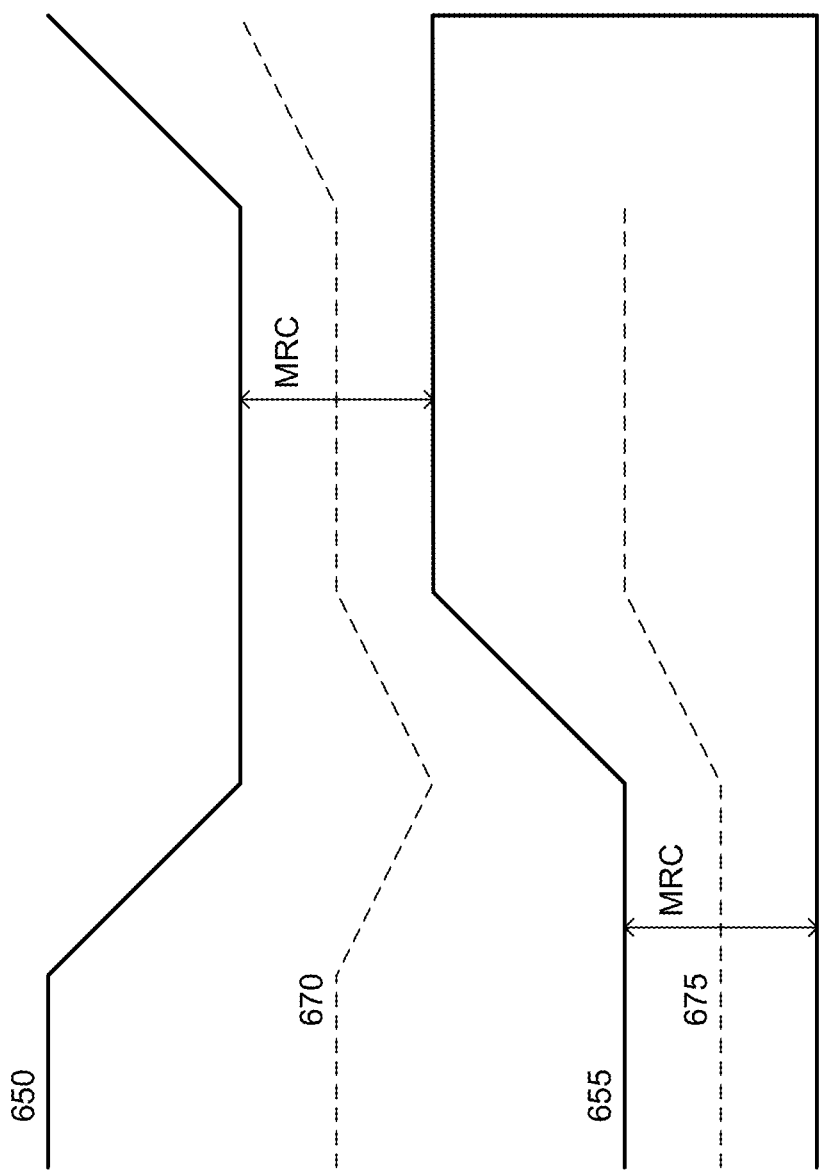

Another way to compute an estimated MRC result is to compute the distances between adjacent skeletons and skeleton elements. FIG. 6 shows two separate skeletons 650 and 655. The skeleton 655 is for a shape that doubles back on itself, for example a U-shape. Note that these are the skeletons themselves and not the shapes. The border of the shapes is omitted for clarity. The double-sided arrows show the locations of possible MRC violations. Given the distance between the two skeletons at these locations and their corresponding size parameters, MRC spacing violations may be assessed.

This detection can be done by using edge to edge search algorithms. Alternatively, it may be done by creating additional "MRC" skeletons 670, 675 of the mask skeletons 650, 655. In this figure, the MRC skeletons are shown as dashed lines, and these skeletons contain information about which mask skeleton edges are closest to them and how far away they are. This information can be used to compute MRC violation locations. This is a useful technique as the skeleton creation naturally determines which edges of skeleton 655 can be compared against each other to determine MRC spacing violations.

Figure 7:
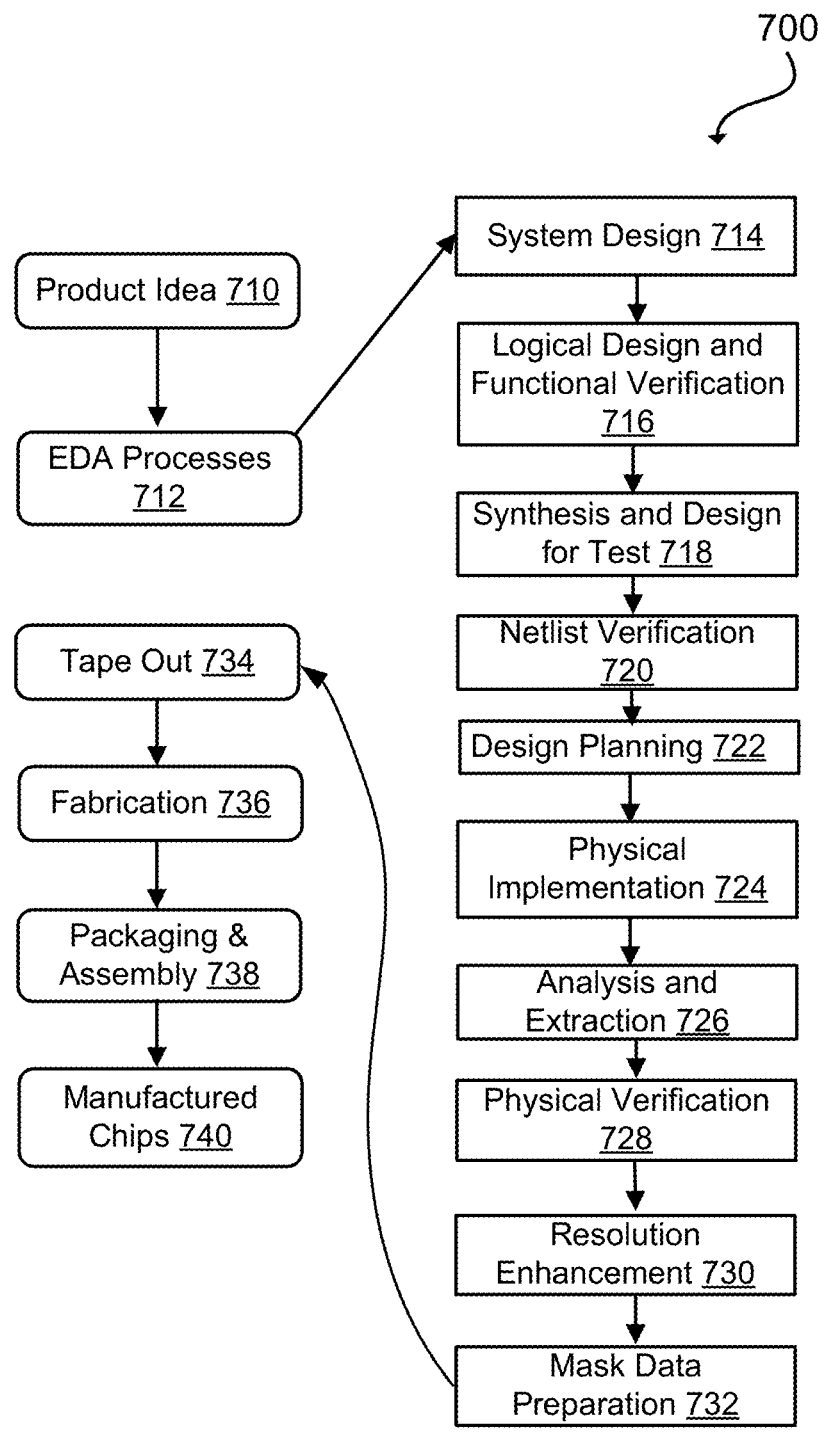
FIG. 7 depicts a flowchart of various processes used during the design and manufacture of an integrated circuit in accordance with some embodiments of the present disclosure.

FIG. 7 illustrates an example set of processes 700 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 710 with information supplied by a designer, information which is transformed to create an article of manufacture that uses a set of EDA processes 712. When the design is finalized, the design is taped-out 734, which is when artwork (e.g., geometric patterns) for the integrated circuit is sent to a fabrication facility to manufacture the mask set, which is then used to manufacture the integrated circuit. After tape-out, a semiconductor die is fabricated 736 and packaging and assembly processes 738 are performed to produce the finished integrated circuit 740.

Specifications for a circuit or electronic structure may range from low-level transistor material layouts to high-level description languages. A high-level of abstraction may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower abstraction level that is a less abstract description adds more useful detail into the design description, for example, more details for the modules that include the description. The lower levels of abstraction that are less abstract descriptions can be generated by a computer, derived from a design library, or created by another design automation process. An example of a specification language at a lower level of abstraction language for specifying more detailed descriptions is SPICE, which is used for detailed descriptions of circuits with many analog components. Descriptions at each level of abstraction are enabled for use by the corresponding tools of that layer (e.g., a formal verification tool). A design process may use a sequence depicted in FIG. 7. The processes described by be enabled by EDA products (or tools).

During system design 714, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 716, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 718, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 720, the netlist is checked for compliance with timing constraints and for correspondence with the HDL code. During design planning 722, an overall floor plan for the integrated circuit is constructed and analyzed for timing and top-level routing.

During layout or physical implementation 724, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 726, the circuit function is verified at the layout level, which permits refinement of the layout design. During physical verification 728, the layout design is checked to ensure that manufacturing constraints are correct, such as DRC constraints, electrical constraints, lithographic constraints, and that circuitry function matches the HDL design specification. During resolution enhancement 730, the geometry of the layout is transformed to improve how the circuit design is manufactured.

During tape-out, data is created to be used (after lithographic enhancements are applied if appropriate) for production of lithography masks. During mask data preparation 732, the 'tape-out' data is used to produce lithography masks that are used to produce finished integrated circuits.

A storage subsystem of a computer system (such as computer system 800 of FIG. 8) may be used to store the programs and data structures that are used by some or all of the EDA products described herein, and products used for development of cells for the library and for physical and logical design that use the library.

Figure 8:
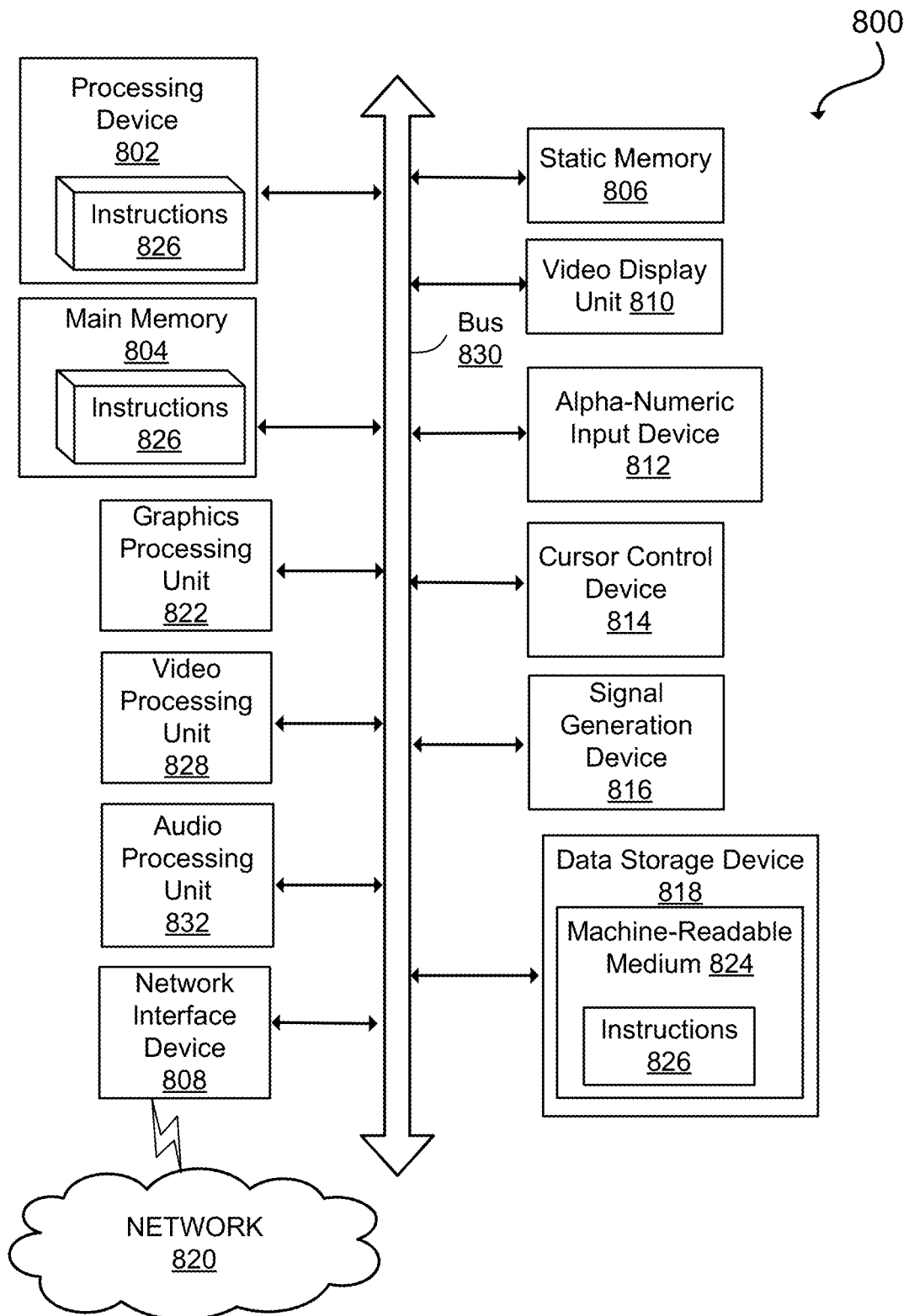
FIG. 8 depicts an abstract diagram of an example computer system in which embodiments of the present disclosure may operate.

FIG. 8 illustrates an example machine of a computer system 800 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM), a static memory 806 (e.g., flash memory, static random access memory (SRAM), etc.), and a data storage device 818, which communicate with each other via a bus 830.

Processing device 802 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 may also be one or more special-purpose processing devices such as an application specific integrated circuit (ASIC), a field programmable gate array (FPGA), a digital signal processor (DSP), network processor, or the like. The processing device 802 may be configured to execute instructions 826 for performing the operations and steps described herein.

The computer system 800 may further include a network interface device 808 to communicate over the network 820. The computer system 800 also may include a video display unit 810 (e.g., a liquid crystal display (LCD) or a cathode ray tube (CRT)), an alphanumeric input device 812 (e.g., a keyboard), a cursor control device 814 (e.g., a mouse), a graphics processing unit 822, a signal generation device 816 (e.g., a speaker), graphics processing unit 822, video processing unit 828, and audio processing unit 832.

The data storage device 818 may include a machine-readable storage medium 824 (also known as a non-transitory computer-readable medium) on which is stored one or more sets of instructions 826 or software embodying any one or more of the methodologies or functions described herein. The instructions 826 may also reside, completely or at least partially, within the main memory 804 and/or within the processing device 802 during execution thereof by the computer system 800, the main memory 804 and the processing device 802 also constituting machine-readable storage media.

In some implementations, the instructions 826 include instructions to implement functionality corresponding to the present disclosure. While the machine-readable storage medium 824 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 802 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method comprising:
   accessing a layout used in a mask development process for a lithographic mask, the layout comprising a plurality of disjoint shapes;
   determining, by a processor, skeleton representations for at least some of the disjoint shapes in the layout, wherein the skeleton representation of an individual shape comprises elements of two or more nodes connected by edges, and size parameters for at least some of the elements, wherein each edge connects two of the nodes by a straight line, and all of the edges and nodes lie within an interior of the individual shape; and
   using the skeleton representations in the mask development process.

2. The method of claim 1 wherein the individual shape is a polygon and determining the skeleton representation of the individual shape comprises:
   determining a Voronoi diagram for the polygon; and
   determining the skeleton representation from the Voronoi diagram.

3. The method of claim 1 wherein the nodes and edges of the skeleton representation of the individual shape are based on a morphological erosion of the individual shape.

4. The method of claim 1 wherein the individual shape is reconstructable by morphological dilation of the nodes and edges of the skeleton representation of the individual shape, in accordance with the size parameters for the nodes and edges.

5. The method of claim 1 wherein the size parameters for edges of skeleton representations are based on widths of the individual shapes along those edges.

6. The method of claim 1 wherein the size parameters for nodes of skeleton representations are based on local radii of the individual shapes at those nodes.

7. The method of claim 1 wherein the edges correspond to an axis of the individual shape.

8. The method of claim 7 wherein the axis is branching.

9. The method of claim 1 wherein the mask development process is one of optical proximity correction and inverse lithography technology, and using the skeleton representations in the mask development process comprises:

determining an effect on a cost function for the mask development process, resulting from changes in locations of the elements of the skeleton representations.

10. The method of claim 1 wherein the mask development process is one of optical proximity correction and inverse lithography technology, and using the skeleton representations in the mask development process comprises:
determining an effect on a cost function for the mask development process, resulting from changes in the size parameters of the skeleton representations.

11. The method of claim 1 wherein the mask development process is mask rule checking, and using the skeleton representations in the mask development process comprises:
determining a spacing between two shapes in the layout based on a spacing between the elements of the skeleton representations for the two shapes and based on the size parameters of said elements.

12. A system comprising:
a memory storing instructions; and
a processor, coupled with the memory and to execute the instructions, the instructions when executed cause the processor to:
access a layout used in a mask development process for a lithographic mask, the layout comprising a plurality of disjoint shapes;
determine skeleton representations for at least some of the disjoint shapes in the layout, wherein the skeleton representation of an individual shape comprises elements of two or more nodes connected by edges, and size parameters for at least some of the elements, and each edge connects two of the nodes by a straight line, and all of the edges and nodes lie within an interior of the individual shape; and
use the skeleton representations in the mask development process.

13. The system of claim 12 wherein the layout is a mask layout for a mask being developed by the mask development process.

14. The system of claim 12 wherein the layout is one of an aerial image produced by the lithographic mask, and a printed pattern produced by the lithographic mask on a wafer.

15. The system of claim 12 wherein the individual shape is a polygon and determining the skeleton representation of the individual shape comprises:
determining a Voronoi diagram for the polygon; and
determining the skeleton representation from the Voronoi diagram.

16. The system of claim 12 wherein the nodes and edges of the skeleton representation of the individual shape are based on a morphological erosion of the individual shape.

17. The system of claim 12 wherein the individual shape is reconstructable by morphological dilation of the nodes and edges of the skeleton representation of the individual shape, in accordance with the size parameters for the nodes and edges.

18. A non-transitory computer readable medium comprising stored instructions, which when executed by a processor, cause the processor to:
access a layout used in a mask development process for a lithographic mask, the layout comprising a plurality of disjoint shapes;
determine skeleton representations for at least some of the disjoint shapes in the layout, wherein the skeleton representation of an individual shape comprises elements of two or more nodes connected by edges, and size parameters for at least some of the elements, and each edge connects two of the nodes by a straight line, and all of the edges and nodes lie within an interior of the individual shape; and
provide the skeleton representations for use in the mask development process.

19. The non-transitory computer readable medium of claim 18 wherein the mask development process is one of optical proximity correction and inverse lithography technology, and using the skeleton representations in the mask development process comprises:
determining an effect on a cost function for the mask development process, resulting from changes in the skeleton representations.

20. The non-transitory computer readable medium of claim 18 wherein the mask development process is mask rule checking, and using the skeleton representations in the mask development process comprises:
determining a spacing between two shapes in the layout based on the skeleton representations for the two shapes.

* * * * *